(12) United States Patent
Cao

(10) Patent No.: US 10,447,299 B2
(45) Date of Patent: Oct. 15, 2019

(54) PRESS-BUTTON CIRCUIT AND DRIVING METHOD THEREOF, KEYPAD, AND DISPLAY DEVICE

(71) Applicants: BOE TECHNOLOGY GROUP CO., LTD., Beijing (CN); K-tronics (Su Zhou) Technology Co., LTD., Suzhou, Jiangsu (CN)

(72) Inventor: Yongming Cao, Beijing (CN)

(73) Assignees: BOE TECHNOLOGY GROUP CO., LTD., Beijing (CN); K-tronics (Su Zhou) Technology Co., LTD., Suzhou, Jiangsu (CN)

( * ) Notice: Subject to any disclaimer, the term of this patent is extended or adjusted under 35 U.S.C. 154(b) by 13 days.

(21) Appl. No.: 15/571,151

(22) PCT Filed: May 5, 2017

(86) PCT No.: PCT/CN2017/083202
§ 371 (c)(1),
(2) Date: Nov. 1, 2017

(87) PCT Pub. No.: WO2017/190683
PCT Pub. Date: Nov. 9, 2017

(65) Prior Publication Data
US 2018/0262208 A1 Sep. 13, 2018

(30) Foreign Application Priority Data

May 6, 2016 (CN) .......................... 2016 1 0298879

(51) Int. Cl.
*G06F 3/02* (2006.01)
*G09G 5/00* (2006.01)
(Continued)

(52) U.S. Cl.
CPC ............. *H03M 11/24* (2013.01); *G06F 3/023* (2013.01); *H03M 11/02* (2013.01)

(58) Field of Classification Search
None
See application file for complete search history.

(56) References Cited

U.S. PATENT DOCUMENTS 5,057,699 A * 10/1991 Spence .............. G05B 19/0423
307/98
6,005,499 A 10/1999 Shafer
(Continued)

FOREIGN PATENT DOCUMENTS

CN 101394185 A * 3/2009
CN 101394185 A 3/2009
(Continued)

OTHER PUBLICATIONS

Second Office Action in the Chinese Patent Application No. 201610298879.1, dated Mar. 30, 2018; English translation attached.
(Continued)

*Primary Examiner* — Lunyi Lao
*Assistant Examiner* — Kirk W Hermann
(74) *Attorney, Agent, or Firm* — Intellectual Valley Law, P.C.

(57) ABSTRACT

Press-button circuit and a driving method thereof are provided. A press-button circuit includes a first sampling port; a second sampling port; a common terminal; a first control device, coupled to the first sampling port and the second sampling port; at least one first press-button sub-circuit, coupled to the first sampling port and the common terminal; and at least one second press-button sub-circuit, coupled to the second sampling port and the common terminal.

19 Claims, 3 Drawing Sheets

(51) Int. Cl.
*H03M 11/24* (2006.01)
*G06F 3/023* (2006.01)
*H03M 11/02* (2006.01)

(56) References Cited

U.S. PATENT DOCUMENTS

| | | | |
|---|---|---|---|
| 6,737,990 | B1 | 5/2004 | Chau |
| 2010/0177076 | A1* | 7/2010 | Essinger ............ G09G 3/3433 345/207 |
| 2015/0006920 | A1 | 1/2015 | Li |

FOREIGN PATENT DOCUMENTS

| | | | | |
|---|---|---|---|---|
| CN | 202261221 | U | | 5/2012 |
| CN | 102565694 | A | * | 7/2012 |
| CN | 102611456 | A | | 7/2012 |
| CN | 102789319 | A | | 11/2012 |
| CN | 103078648 | A | | 5/2013 |
| CN | 202931275 | U | | 5/2013 |
| CN | 103701472 | A | | 4/2014 |
| CN | 104251971 | A | | 12/2014 |
| CN | 105141301 | A | * | 12/2015 |
| CN | 105141301 | A | | 12/2015 |

OTHER PUBLICATIONS

International Search Report & Written Opinion dated Aug. 2, 2017, regarding PCT/CN2017/083202.
First Office Action in the Chinese Patent Application No. 201610298879.1, dated Sep. 29, 2017; English translation attached.

* cited by examiner

FIG. 2

Switching on the first control device and the second control device, to form a circuit arrangement including (m+n+i) press-button branch circuits between each of the first sampling port and the second sampling port, and the common terminal, each press-button branch circuit having a voltage divider referenced to the common terminal —S201

Switching on the first control device and switching off the second control device, to form a circuit arrangement including (m+n) key branches between the first sampling port and the common terminal, each one of the (m+n) press-button branch circuits having a voltage divider referenced to the common terminal, and having i key branches between the second sampling port and the common terminal, each one of the i press-button branch circuits having a voltage divider referenced to the common terminal —S202

Switching off the first control device and switching on the second control device, to form a circuit arrangement having m key branches between the first sampling port and the common terminal, each one of the m key branches having a voltage divider referenced to the common terminal, and having (n+i) press-button branch circuits between the second sampling port and the common terminal, each one of the (n+i) press-button branch circuits having a voltage divider referenced to the common terminal —S203

PRESS-BUTTON CIRCUIT AND DRIVING METHOD THEREOF, KEYPAD, AND DISPLAY DEVICE

CROSS-REFERENCE TO RELATED APPLICATION

This application is a national stage application under 35 U.S.C. § 371 of International Application No. PCT/CN2017/083202, filed May 5, 2017, which claims priority to Chinese Patent Application No. 201610298879.1, filed May 6, 2016, the contents of which are incorporated by reference in the entirety.

TECHNICAL FIELD

The present invention relates to display technology and, more particularly, to a press-button circuit and a driving method thereof, a keypad containing the press-button circuit, and a display device containing the keypad.

BACKGROUND

For a conventional TV keypad, the design of motherboard in a customer reference board often utilizes 2-way or 1-way general purpose input output (GPIO) signals to respectively pass a plurality of press-button sub-circuits to facilitate control voltage sampling. Corresponding voltage-dividing resistors may be designed in each sub-circuit. Based on different ways of key designs by different manufactures, the press-button circuit arrangement in a common motherboard often includes a 1-way GPIO signal passing through 7 press-button sub-circuits each having a voltage divider referenced to ground, and 2-way GPIO signals respectively passing through 3 or 4 press-button sub-circuits each having a voltage divider referenced to ground. Because the press-button circuit arrangement, in a motherboard, provided by different manufactures is often not compatible, a product of an industrial design often requires configuring several TV keypads to match the product. The manufacturing of the product may require an undesired amount of labor and time, and can be costly.

SUMMARY

One aspect of the present disclosure provides a press-button circuit. The press-button circuit includes a first sampling port; a second sampling port; a common terminal; a first control device, coupled to the first sampling port and the second sampling port; at least one first press-button sub-circuit, coupled to the first sampling port and the common terminal; and at least one second press-button sub-circuit, coupled to the second sampling port and the common terminal.

Optionally, the press-button circuit further includes a first node, coupled to the first sampling port via the first control device, and coupled to the second sampling port via a second control device; and at least one third press-button sub-circuit, coupled to the first node and the common terminal. The first control device is configured to control a connection between the first node and the first sampling port, and the second control device is configured to control a connection between the first node and the second sampling port.

Optionally, the at least one first press-button sub-circuit, the at least one second press-button sub-circuit, and the at least one third press-button sub-circuit are arranged in parallel with one another.

Optionally, each of the at least one first press-button sub-circuit, the at least one second press-button sub-circuit, and the at least one third press-button sub-circuit includes a voltage divider.

Optionally, each of voltage dividers of any two of all of the at least one first press-button sub-circuit and the at least one third press-button sub-circuit includes a fixed-value resistor having a different resistance.

Optionally, each of voltage dividers of any two of all of the at least one second press-button sub-circuit and the at least one third press-button sub-circuit includes a fixed-value resistor having a different resistance.

Optionally, the at least one first press-button sub-circuit includes a number of three first press-button sub-circuits, coupled to the first sampling port and the common terminal, the at least one second press-button sub-circuit includes a number of three second press-button sub-circuits, coupled to the second sampling port and the common terminal, and the at least one third press-button sub-circuit includes one third press-button sub-circuit, coupled to the first node and the common terminal.

Optionally, the press-button circuit further includes: a third sampling port, a third control device, a fourth control device, a second node, coupled to the third sampling port via the third control device, and coupled to at least the first sampling port via the fourth control device, and at least one fourth press-button sub-circuit coupled to the second node and the common terminal. The second node is further coupled to the second sampling port via the first and second control devices. The third control device is configured to control a connection between the second node and the third sampling port, and the fourth control device is configured to control a connection between the second node and, the first and second sampling ports.

Optionally, each of the at least one first press-button sub-circuit, the at least one second press-button sub-circuit, and the at least one third press-button sub-circuit includes a key configured in series with a fixed-value resistor.

Optionally, each of the first and second control devices is one of a variable resistor, a switch, a transistor, and a potentiometer.

Optionally, the common terminal is connected to ground.

Another aspect of the present disclosure provides a display device. The display device includes a keypad. The keypad includes the disclosed press-button circuit.

Optionally, the keypad further includes: a motherboard controller. The motherboard controller includes a first general purpose input output (GPIO) port coupled to the first sampling port, and a second general purpose input output (GPIO) port coupled to the second sampling port. The motherboard controller is configured to provide a voltage to the common terminal.

Another aspect of the present disclosure provides a method for driving a press-button circuit, including providing the press-button circuit. The press-button circuit includes: a node, coupled to a first sampling port via a first control device, and coupled to a second sampling port via the second control device; a number of (m) first press-button sub-circuits, coupled to the first sampling port and the common terminal; a number of (n) second press-button sub-circuits, coupled to the second sampling port and the common terminal; and a number of (i) third press-button sub-circuits, coupled to the node and the common terminal, where m, n, and i are integers of 1 or greater. The first and second control devices are controlled, such that the first, second, and third press-button sub-circuits form a sampling port through a circuit arrangement including (m+n+i) press-button sub-circuits. The first and second control devices are controlled, such that the tint sampling port uses a circuit arrangement including (m+n) press-button sub-circuits, and the second sampling port uses a circuit arrangement including (i) press-button sub-circuits. The first and second control devices are controlled, such that the first sampling port uses a circuit arrangement including (m) press-button sub-circuits, and the second sampling port uses a circuit arrangement including (n+i) press-button sub-circuits.

Optionally, each of the number of (m) first press-button sub-circuits, the number of (n) second press-button sub-circuits, and the number of (i) third press-button sub-circuits includes a voltage divider.

Optionally, each of the first and second control devices is one of a variable resistor, a switch, a transistor, and a potentiometer.

Optionally, controlling the first and second control devices includes: switching on the first and second control devices to provide the circuit arrangement including the (m+n+i) press-button sub-circuits, switching on the first control device and switching off the second control device to provide the circuit arrangement including the (m+n) press-button sub-circuits for the first sampling port and to provide the circuit arrangement including the (i) press-button sub-circuits, and switching off the first control device and switching on the second control device to provide the circuit arrangement including the (m) press-button sub-circuits and to provide the circuit arrangement including the (n+i) press-button sub-circuits.

Optionally, each of voltage dividers of any two of all of the number of (m) first press-button sub-circuit and the number of (i) third press-button sub-circuits includes a fixed-value resistor having a different resistance.

Optionally, each of voltage dividers of any two of all of the number of (n) second press-button sub-circuit and the number of (i) third press-button sub-circuits includes a fixed-value resistor having a different resistance.

Optionally, the common terminal is connected to ground.

BRIEF DESCRIPTION OF THE FIGURES

The following drawings are merely examples for illustrative purposes according to various disclosed embodiments and are not intended to limit the scope of the present invention.

FIG. 2 illustrates an exemplary flow chart of a process to operate a press-button circuit according to various disclosed embodiments of the present disclosure;

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1A:
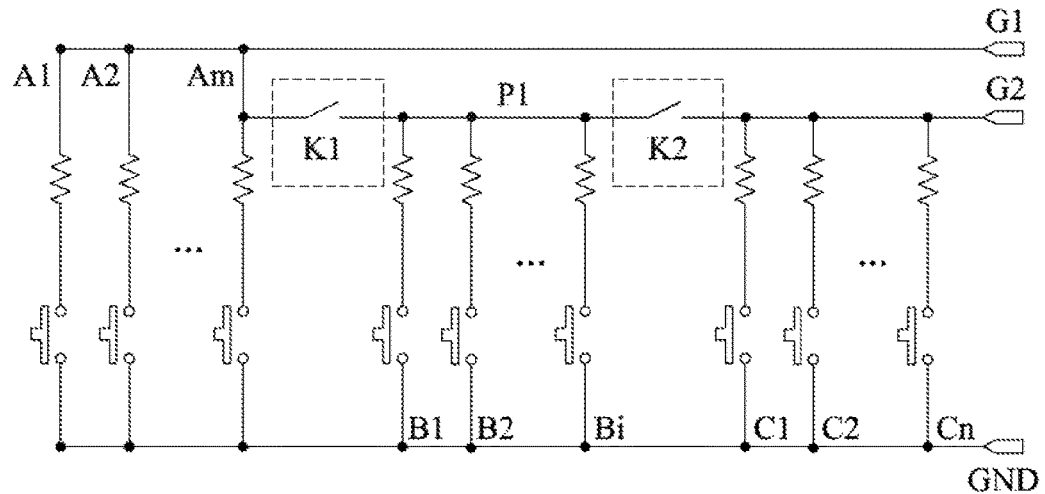
FIG. 1A illustrates an exemplary press-button circuit according to various disclosed embodiments of the present disclosure.

FIG. 1A illustrates the structure of an exemplary press-button circuit in some embodiments. As shown in FIG. 1A, the press-button circuit may include a first sampling port G1, a second sampling port G2, and a common terminal GND. The press-button circuit may also include: at least one press-button sub-circuit, i.e. A1, A2, ..., and Am (m≥1), between the first sampling port G1 and the common terminal GND; at least one press-button sub-circuit, i.e. C1, C2, ..., and Cn (n≥1), between the second sampling port G2 and the common terminal GND; and at least one press-button sub-circuit, i.e. B1, B2, ..., and Bi (i≥1), between the first node P1 and the common terminal GND.

The first node P1 may be connected to or coupled to the first sampling port G1 through a first control device K1, and the first node may also be coupled to the second sampling port G2 through a second control device K2. The first control device K1 and the second control device K2 may each switch between an ON state and an OFF state under a control signal. The control signal may be an external signal. The ON state may refer to the state that the first node P1 and the first sampling port G1 are connected, or the state that first node P1 and the second sampling port G2 are connected. The OFF state may refer to the state the first node P1 and the first sampling port G1 are disconnected, or the state that first node P1 and the second sampling port G2 are disconnected. In the present disclosure, term "coupled to" and term "connected to" may be interchangeable. An object may be coupled to another object through any suitable couplings, e.g., electrical coupling, mechanical coupling, and magnetic coupling.

In some embodiments, besides the configuration shown in FIG. 1A, i.e., keys and fixed-value resistors connected in series in a press-button sub-circuit, other components and/or devices may be added into the press-button circuit. In some embodiments, other components and/or device may replace certain components shown in FIG. 1A. The fixed-value resistors may also be formed by any suitable components/elements having resistance characteristics, or may be formed with a component having a resistance of zero ohm. The specific configuration of the press-button sub-circuits should be determined according to different designs and/or application and should not be limited by the embodiments of the present disclosure.

The control devices may refer to the circuit element that can switch between the ON state and the OFF state under an external control signal. For example, a control device may be a transistor that can switch on and off under the control of an external gate voltage, or a push-button switch that opens or closes when a metal pad is pressed with an external force, and/or a potentiometer that switches between a high-impedance state and an ON state under the sliding of a movable contact. In addition, the control device may also be at least one of a variable resistor, a switch, a transistor, and a relay, to meet the requirements of various products and manufacturing processes.

FIG. 2 illustrates an exemplary process to operate the press-button circuit shown FIG. 1A. As shown in FIG. 2, the process may include steps S201-S203.

In step S201, the first control device and the second control device may each he switched on to the ON state, to form a circuit arrangement including (m+n+i) press-button sub-circuits between each of the first sampling port and the second sampling port, and the common terminal, each press-button sub-circuit having a voltage divider referenced to the common terminal. In some embodiments, the voltage divider may provide a non-zero resistance. In some embodiments, the voltage divider may provide a zero resistance.

In step S202, the first control device may be switched on and the second control device may be switched off to the OFF state, to form a circuit arrangement including (m+n) press-button sub-circuits between the first sampling port and the common terminal, each one of the (m+n) press-button sub-circuits having a voltage divider referenced to the common terminal, and having i press-button sub-circuits between the second sampling port and the common terminal, each one of the i press-button sub-circuits having a voltage divider referenced to the common terminal.

In step S203, the first control device may be switched off and the second control device may be switched on, to form a circuit arrangement having m press-button sub-circuits between the first sampling port and the common terminal, each one of the m press-button sub-circuits having a voltage divider referenced to the common terminal, and having (n+i) press-button sub-circuits between the second sampling port and the common terminal, each one of the (n+i) press-button sub-circuits having a voltage divider referenced to the common terminal.

In the embodiments, m may represent the number of press-button sub-circuits connected between the first sampling terminal and the common terminal, n may represent the number of press-button sub-circuits connected between the first node and the common terminal, and i may represent the number of press-button sub-circuits connected between the second sampling port and the common terminal, where m, n, and i may be integers greater than 1. In various embodiments, the order to execute steps S201-S203 should vary according to different designs and applications. The specific order to execute steps S201-S203 should not be limited by the embodiments of the present disclosure.

The voltage dividers, between the first sampling port and the common terminal, between the second sampling port and the common terminal, and between the node and the common terminal, may each include a fixed-value resistor, as shown in FIG. 1A. The resistance of a fixed-value resistor may be constant.

As shown in FIG. 1A, following step S201, the first control device K1 and the second control device K2 may each be switched on, so that the first sampling port G1 and the second sampling port G2 may both be connected to the first node P1. Thus, m press-button sub-circuits A1, A2, . . . , and Am, i press-button sub-circuits B1, B2, . . . , and Bi, and n press-button sub-circuits C1, C2, . . . , and Cn may be connected in parallel between the first sampling port G1 (also the second sampling port G2) and the common terminal GND. Accordingly, the abovementioned configuration may be suitable for the type of press-button circuit arrangement, in a motherboard, having a 1-way GPIO signal passing through a plurality (i.e., (m+n+i) in the exemplified embodiment) of press-button sub-circuits each having a voltage divider referenced to around.

As shown in FIG. 1A, following step S202, the first control device K1 may be switched on and the second control device K2 may be switched off, so that the first node P1 may be connected to the first sampling port G1 and the first node P1 may be disconnected from the second sampling port G2. Thus, m press-button sub-circuits A1, A2, . . . , and Am may be connected in parallel with i press-button sub-circuits B1, B2, . . . , and Bi, between the first sampling port G1 and the common terminal GND; and n press-button sub-circuits C1, C2, . . . , and Cn may be connected in parallel between the second sampling port G2 and the common terminal GND. Accordingly, the abovementioned configuration may be suitable for the type of press-button circuit arrangement, in a motherboard, having a 2-way GPIO signals each passing through a plurality (i.e., (m+i) and n, respectively in the exemplified embodiment) of press-button sub-circuits each having a voltage divider referenced to ground.

As shown in FIG. 1A, following step S203, the first control device K1 may be switched off and the second control device K2 may be switched on, so that the first node P1 may be connected to the second sampling port G2 and the first node P1 may be disconnected from the first sampling port G1. Thus, in press-button sub-circuits A1, A2 , . . . , and Am may be connected in parallel between the first sampling port G1 and the common terminal GND, and n press-button sub-circuits C1, C2, . . . , and Cn may be connected in parallel with i press-button sub-circuits B1, B2, . . . , and Bi, between the second sampling port G2 and the common terminal GND. Accordingly, the abovementioned configuration may be suitable for the type oppress-button circuit arrangement, in a motherboard, having a 2-way GPIO signals each passing through a plurality (i.e., m and (n+i), respectively in the exemplified embodiment) of press-button sub-circuits each having a voltage divider referenced to ground.

Further, when the first control device K1 and the second control device K2 are each switched off, the first node P1 may be floating, so that i press-button sub-circuits B1, B2, . . . , and Bi may be ineffective, in press-button sub-circuits A1, A2, . . . , and Am may be connected in parallel between the first sampling port G1 and the common terminal GND, and n press-button sub-circuits C1, C2, . . . , and Cn may be connected in parallel between the second sampling port G2 and the common terminal GND. Accordingly, the abovementioned configuration may be suitable for the type of press-button circuit arrangement, in a motherboard, having a 2-way GPIO signals each passing through a plurality (i.e., m and n, respectively in the exemplified embodiment) of press-button sub-circuits each having a voltage divider referenced to ground.

In the present disclosure, the press-button circuit may be based on the first control device, the second control device, and the at least one press-button sub-circuits between the first node and the common terminal. By using the disclosed method to operate the press-button circuit, the ON/OFF status of the first control device and the second control device may be changed, and the type oppress-button circuit arrangement may be changed accordingly. Thus, the disclosed press-button circuit and the disclosed method for operating the press-button circuit may be compatible with various press-button circuit arrangement types in a motherboard. Problems caused by incompatibility among motherboard press-button circuit arrangement by different manufacturers may be resolved. Compared to conventional technology, the disclosed press-button circuit and the method for operating the press-button circuit may facilitate motherboard design with higher compatibility. The manufacturing process of the motherboard may be simplified and may be less costly.

Figure 3:
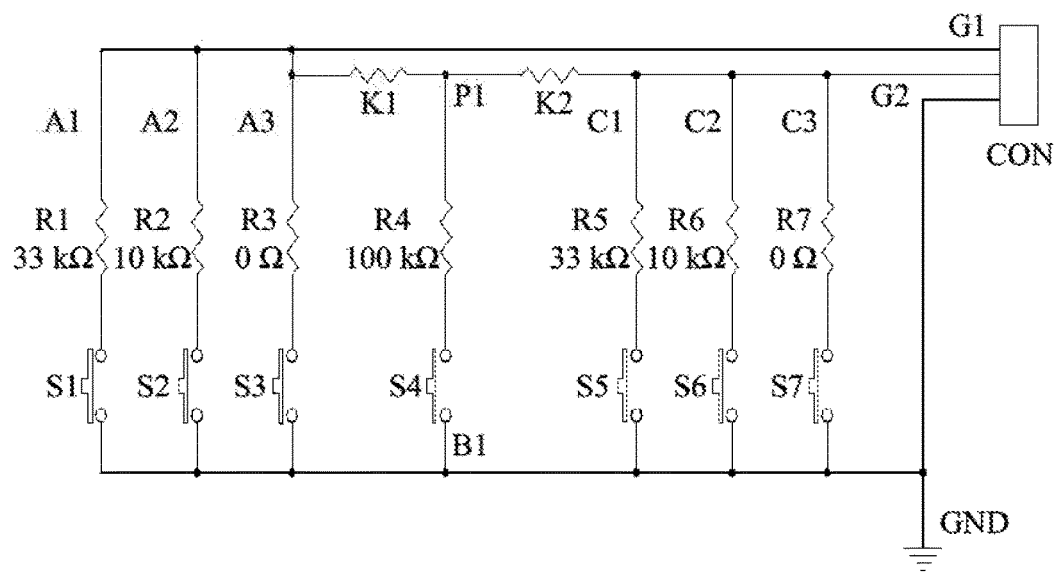
FIG. 3 illustrates another exemplary press-button circuit according to various disclosed embodiments of the present disclosure.

FIG. 3 illustrates the structure of specific exemplary press-button circuit provided by the present disclosure. As shown in FIG. 3, compared to the press-button circuit shown in FIG. 1A, the at least one press-button sub-circuits A1, A2, . . . , and Am between the first sampling port G1 and the common terminal GND may include three press-button sub-circuits A1, A2, and A3 (i.e., m=3); the at least one press-button sub-circuits C1, C2, . . . , and Cn between the second sampling port G2 and the common terminal GND may include three press-button sub-circuits C1, C2, and C3; and the at least one press-button sub-circuits B1, B2, ..., and Bi between the first node P1 and the common terminal GND may include one press-button sub-circuit B (i.e., i=1).

The press-button circuit shown in FIG. 3 may be suitable for the following four types of motherboard press-button circuit arrangement: a 2-way GPIO signals respectively passing through three and four press-button sub-circuits, each press-button sub-circuit having a voltage divider referenced to ground; a 2-way GPIO signals respectively passing through four and three press-button sub-circuits, each press-button sub-circuit having a voltage divider referenced to ground; a 2-way GPIO signals respectively passing through three and three press-button sub-circuits, each press-button sub-circuit having a voltage divider referenced to ground; and a 1-way GPIO signal passing through seven press-button sub-circuits, each press-button sub-circuit having a voltage divider referenced to ground.

As shown in FIG. 3, in some embodiments, variable resistors may be used as the first control device and the second control device, and the resistances of fixed-value resistors in the seven press-button sub-circuits (A1, A2, A3, B1, C1, C2, and C3) may be R1=33 kΩ, R2=10 kΩ, R3=0Ω, R4=100 kΩ, R5=33 kΩ, R6=10 kΩ, and R7=0Ω. As an embodiment of a press-button circuit, the first sampling port G1 in the press-button circuit may be operatively coupled to, e.g., electrically connected to the first GPIO port for the first keys in the motherboard controller CON; the second sampling port G2 in the press-button circuit may be operatively coupled to, e.g., electrically connected to the second GPIO port for the second keys in the motherboard controller CON; and the voltage of the common terminal GND may be provided by the motherboard controller CON.

In one embodiment, the motherboard controller CON may detect the status of a key. As shown in FIG. 3, When the first control device K1 is switched on and the second control device K2 is switched off the motherboard controller CON may apply a voltage of U0 between the first sampling port G1 and the common terminal GND, to detect the total current I0 between the first sampling port G1 and the common terminal GND, so as to further determine the resistance U0/I0 between the first sampling port G1 and the common terminal GND. Thus, by comparing the value of U0/I0 with the values of R1, R2, R3, and R4, the motherboard controller CON may determine which ones of keys S1, S2, S3, and S4 are pushed down. Thus, the status of a first key or button may be detected.

In various embodiments, the resistance of the fixed-value resistor in the press-button sub-circuit corresponding to one first key may be different from the resistance of the fixed-value resistor in the press-button sub-circuit corresponding to another first key, and the resistance of the fixed-value resistor in the press-button sub-circuit corresponding to one second key may be different from the resistance of the fixed-value resistor in the press-button sub-circuit corresponding to another second key. Thus, the distinguishable requirements for key status detection may be satisfied.

Thus, in the press-button circuit as shown in FIG. 1A, to satisfy the distinguishable requirements for 2-way GPIO signals, the fixed-value resistor in any one of the press-button sub-circuits, between the first sampling port G1 and the common terminal GND and between the first node P1 and the common terminal GND (including A1, A2, ..., Am, B1, B2, ..., Bi), may each have a different resistance. Correspondingly, the fixed-value resistor in any one of the press-button sub-circuits, between the second sampling port G2 and the common terminal GND and between the first node P1 and the common terminal GND (including B1, B2, ..., Bi, C1, C2, ..., Cn), may each have a different resistance. Thus, i press-button sub-circuits B1, B2, ..., and Bi may be compatible with the key status detection processes under a plurality of different circuit arrangements. The disclosed press-button circuit may be more versatile.

For example, a fixed-value resistor that is configured in series with a key in a corresponding press-button sub-circuit may be used as a voltage-dividing resistor in the corresponding press-button sub-circuit.

It should be noted that, for illustrative purposes, two control devices, one node, and two sampling ports are used to describe the present disclosure. In various embodiments, the number of control devices, capable of switching between an ON state and an OFF state, the number of nodes, and the number of sampling ports, may vary according to different applications and/or designs of press-button circuits. Thus, motherboards containing the disclosed press-button circuit may be compatible with different press-button circuits may be realized.

Figure 1B:
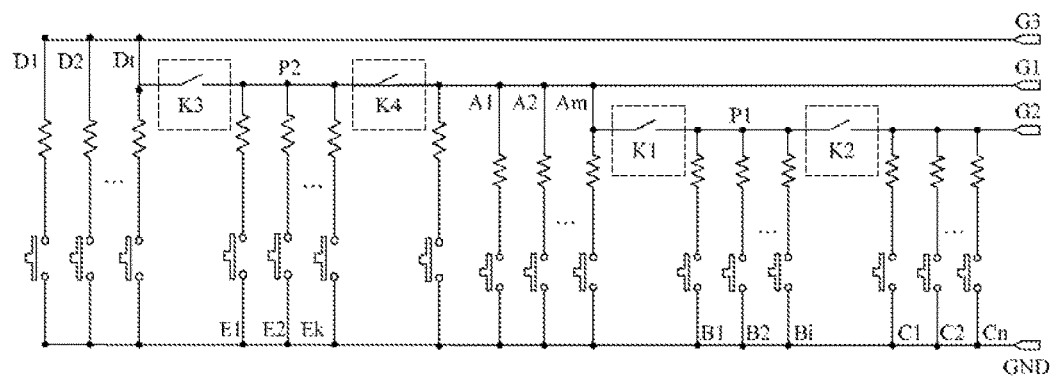
FIG. 1B illustrates another exemplary press-button circuit according to various disclosed embodiments of the present disclosure.

For example, as shown in FIG. 1B, the disclosed press-button circuit may further include a third sampling port G3, a third control device K3 and a fourth control device K4. The third control device K3 and the fourth control device K4 may be arranged between the third sampling port G3 and each of the first sampling port G1 and the second sampling port G2, and a second node P2 may be arranged between the third control device K3 and the fourth control device K4.

Similar to the arrangement of press-button sub-circuits in the structure shown in FIG. 1A, at least one press-button sub-circuits may be arranged between the second node P2 and the common terminal GND, and at least one press-button sub-circuits may be arranged between the third sampling port G3 and the common terminal GND. Between the third sampling port G3 and the common terminal GND, t press-button sub-circuits (D1, D2, ..., Dt) may be arranged in parallel with one another. Between the second node P2 and the common terminal GND, k press-button sub-circuits (E1, E2, ..., Ek) may be arranged in parallel with one another. The second node P2 may be coupled to the third sampling port G3 through the third control device K3, and the second node P2 may be coupled to the first sampling port G1 and the second sampling port G2 through the fourth control device K4, the first control device K1, and the second control device K2. The third control device K3 may be configured to switch on and off to connect and disconnect the second node P2 and the third sampling port G3, and the fourth control device K4 may be configured to switch on and off to connect and disconnect the second node P2 from the first sampling port G1 and the second sampling port G2.

When the third control device K3 is turn on, i.e., connected, the t press-button sub-circuits and the k press-button sub-circuits may be connected in parallel. Further, when the fourth control device K4 and the third control device K3 are both turned on, the t press-button sub-circuits and the k press-button sub-circuits may be connected in parallel with the m press-button sub-circuits between the first sampling port G1 and the common terminal GND. Thus, more GPIO signals may be transmitted on the third sampling port G3 to the common terminal GND. Similarly, more sampling ports may be added to include more press-button sub-circuits, to transmit more GPIO signals as desired.

Embodiments of the present disclosure further provide a keypad such as a TV keypad. The TV keypad may include any one of the press-button circuit aforementioned, and problems caused by incompatibility among press-button circuit arrangement made by different manufacturers can be resolved. Motherboards compatible with different types of press-button circuit arrangement may be realized. The manufacturing of motherboards may be simplified and less costly. The disclosed TV keypad disclosed may also be used in any suitable structures that require TV control keypads, such as TVs and TV remotes. The specific application of the TV keypad should not be limited by the embodiments of the present disclosure.

The present disclosure may further provide a display device. The display device may include any one of the disclosed press-button circuits, to solve the problems caused by incompatibility among press-button circuit arrangement made by different manufacturers. Motherboards compatible with different press-button circuits may be realized. The manufacturing of keypads may be simplified and less costly. The disclosed display device may be one or more of a display panel, an electronic paper, a mobile phone, a tablet computer, a TV, a laptop computer, a digital photo frame, a navigation device, and any other products or parts with display functions.

Figure 4:
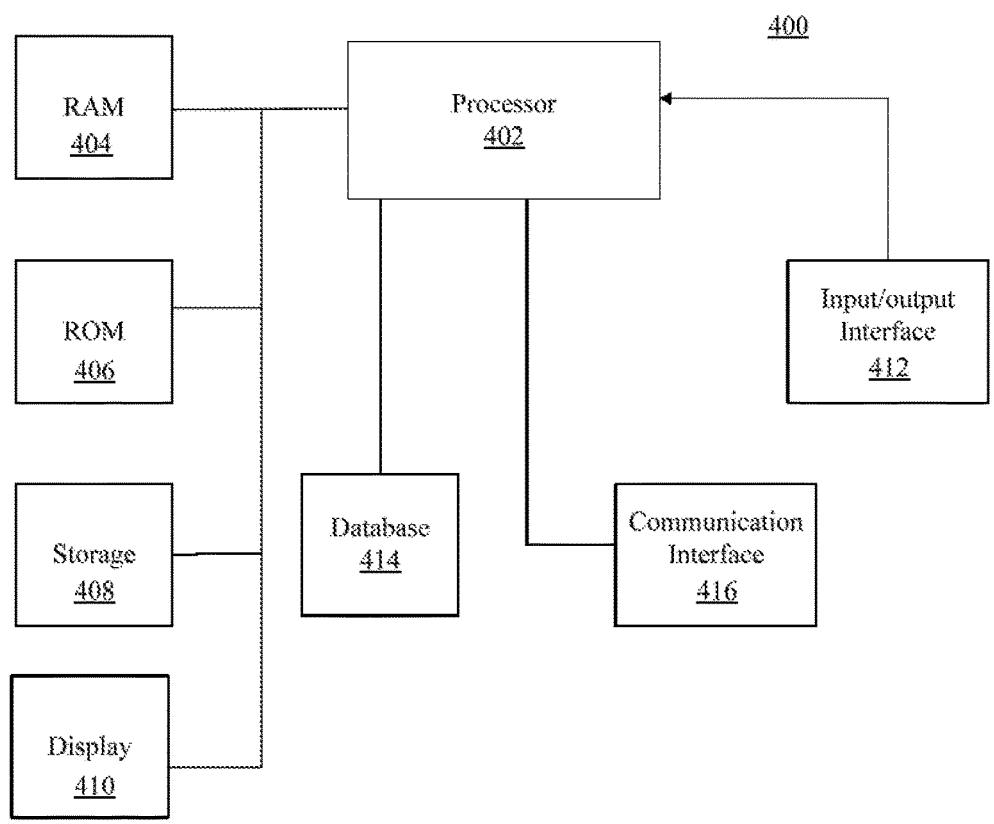
FIG. 4 illustrates a block diagram of a motherboard controller used in various embodiments of the present disclosure.

FIG. 4 illustrates a block diagram of a motherboard controller CON 400.

The motherboard controller CON 400 may receive, process, and execute commands from the display apparatus. The motherboard controller CON 400 may include any appropriately configured computer system. As shown in FIG. 12, motherboard controller CON 400 may include a processor 402, a random access memory (RAM) 404, a read-only memory (ROM) 406, a storage 408, a display 410, an input/output interface 412, a database 414; and a communication interface 416. Other components may be added and certain devices may be removed without departing from the principles of the disclosed embodiments.

Processor 402 may include any appropriate type of general purpose microprocessor, digital signal processor or microcontroller, and application specific integrated circuit (ASIC). Processor 402 may execute sequences of computer program instructions to perform various processes associated with motherboard controller CON 400. Computer program instructions may be loaded into RAM 404 for execution by processor 402 from read-only memory 406, or from storage 408. Storage 408 may include any appropriate type of mass storage provided to store any type of information that processor 402 may need to perform the processes.

Display 410 may provide information to a user or users of the motherboard controller CON 400. Display 410 may include any appropriate type of computer display device or electrode device display (e.g. CRT or LCD based devices). Input/output interface 412 may be provided for users to input information into motherboard controller CON 400 or for the users to receive information from motherboard controller CON 400. For example, input/output interface 412 may include any appropriate input device, such as a keyboard, a mouse, an electronic tablet, voice communication devices, touch screens, or any other optical or wireless input devices. Further, input/output interface 412 may receive from and/or send to other external devices.

Further, database 414 may include any type of commercial or customized database, and may also include analysis tools for analyzing the information in the databases. Database 414 may be used for storing information controlling the motherboard. Communication interface 416 may provide communication connections such that motherboard controller CON 400 may be accessed remotely and/or communicate with other systems through computer networks or other communication networks via various communication protocols, such as transmission control protocol/internet protocol (TCP/IP), hyper text transfer protocol (HTTP), etc.

In one embodiment, the processor 402 may be configured to control the ON and OFF states of the first control device and the second control device, and may detect the current between a sampling port and the common terminal, based on the computer programs stored in the storage 408. The motherboard controller CON 400 may also store the detected results in the storage 408. Resistances of the fixed-values may be stored in the database 414. The processor 402 may also compare the detected resistance between a sampling port and the common terminal and compare the detected resistance with the resistance of the corresponding fixed-value resistor, to determine if the key corresponding to the fixed-value resistor is pushed down.

For example, referring to FIG. 1A, the motherboard controller CON 400 may switch on the first control device and the second control device, to form a circuit arrangement including (m+n+i) press-button sub-circuits between each of the first sampling port and the second sampling port, and the common terminal, each press-button sub-circuit having a voltage divider referenced to the common terminal. Thus, a 1-way GPIO signal passing through a plurality (i.e., (m+n+i) in the exemplified embodiment) of press-button sub-circuits each having a voltage divider referenced to ground.

Also, the mother board controller CON 400 may switch on the first control device and switch off the second control device, to form a circuit arrangement including (m+n) press-button sub-circuits between the first sampling port and the common terminal, each one of the (m+n) press-button sub-circuits having a voltage divider referenced to the common terminal, and having i press-button sub-circuits between the second sampling port and the common terminal, each one of the i press-button sub-circuits having a voltage divider referenced to the common terminal. Thus, a 2-way GPIO signals each passing through a plurality (i.e., (m+i) and n, respectively in the exemplified embodiment) of press-button sub-circuits each having a voltage divider referenced to ground.

In the present disclosure, relational terms such as first and second are used merely to distinguish one entity/operation from another entity/operation without necessarily requiring or implying specific orders or relations among such entities or operations. Terms such as "including", "having", "comprising", or any other variations are intended to encompass non-exclusive inclusions such that a process, method, article, or device that includes a set of elements includes not only those elements but also those that are not explicitly listed, or may also include elements inherent to such process, method, article, or device. Without more limitations, the elements defined by the terms "comprising a" do not preclude the presence of additional elements in the process, method, article, or device that includes the element. The orientation or positional relationship indicated by the terms "above", "below" and the like is based on the orientation or positional relationship shown in the figures and is merely for the ease of describing the invention and simplifying the description, and is not used for indicating or implying the device or element referred to must have the specific orientations or are constructed and operated in a particular orientation, and therefore are not to be construed as limiting the invention. The term "mounted", "connected", and "coupled" shall be understood broadly, unless the context clearly dictates otherwise. For example, a connection may be a fixed connection, a detachable connection, or an integral connection. A connection may also be a mechanical connection or an electrical connection. A connection may also be directly connected or indirectly connected through an intermediary, or an internal connection between two components. It will be apparent to one of ordinary skill in the art that the specific meaning of the abovementioned terms in the present invention may be understood according to different applications and designs and should not be limited by the embodiments of the present disclosure.

In the description of the present disclosure, numerous specific details are described. It should be understood, however, that the embodiments of the present disclosure may be practiced without these specific details. In some embodiments, well-known methods, structures, and techniques have not been shown in detail in order not to obscure the understanding of this specification. Similarly, in order to simplify the disclosure and assist in the understanding of one or more of the various inventive aspects, in the above description of exemplary embodiments of the present disclosure, various features of the disclosure are sometimes grouped together into a single embodiment, graph, or description thereof.

The foregoing description of the embodiments of the invention has been presented for purposes of illustration and description. It is not intended to be exhaustive to or limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is Intended to be dedicated to the public regardless of whether the element or component is explicitly melted in the following claims.

What is claimed is:

1. A press-button circuit, comprising:
    a first sampling port;
    a second sampling port;
    a common terminal;
    a first control device, coupled to the first sampling port and the second sampling port;
    a second control device, coupled to the first sampling port and the second sampling port;
    a first node, coupled to the first sampling port via the first control device, and coupled to the second sampling port via the second control device;
    m number of first press-button sub-circuits, coupled to the first sampling port and the common terminal;
    n number of second press-button sub-circuits, coupled to the second sampling port and the common terminal;
    i number of third press-button sub-circuits, coupled to the first node and the common terminal;
    wherein m, n, and i are integers of 1 or greater;
    the first control device is configured to control a connection between the first node and the first sampling port;
    the second control device is configured to control a connection between the first node and the second sampling port;
    wherein the first control device and the second control device are configured to:
        control the m number of first press-button sub-circuits, the n number of second press-button sub-circuits, and the i number of third press-button sub-circuits to form a first sampling port through a first circuit arrangement including the m number of first press-button sub-circuits, the n number of second press-button sub-circuits, and the i number of third press-button sub-circuits;
        controlling the first sampling port to use a second circuit arrangement including the m number of first press-button sub-circuits and the n number of second press-button sub-circuits, and controlling the second sampling port to use a third circuit arrangement including the i number of third press-button sub-circuits; and
        controlling the first sampling port to use a fourth circuit arrangement including the m number of first press-button sub-circuits, and controlling the second sampling port to use a fifth circuit arrangement including the n number of second press-button sub-circuits and the i number of third press-button sub-circuits.

2. The press-button circuit according to claim 1, wherein:
the m number of first press-button sub-circuits, the n number of second press-button sub-circuits, and the i number of third press-button sub-circuits are arranged in parallel with one another.

3. The press-button circuit according to claim 1, wherein:
each of the m number of first press-button sub-circuits, the n number of second press-button sub-circuits, and the i number of third press-button sub-circuits includes a voltage divider.

4. The press-button circuit according to claim 3, wherein:
each of the voltage dividers of any two of all of the m number of first press-button sub-circuits and the i number of third press-button sub-circuits includes a fixed-value resistor having a different resistance.

5. The press-button circuit according to claim 3, wherein:
each of the voltage dividers of any two of all of the n number of second press-button sub-circuits and the i number of third press-button sub-circuits includes a fixed-value resistor having a different resistance.

6. The press-button circuit according to claim 1, wherein:
the m number of first press-button sub-circuits includes a number of three first press-button sub-circuits, coupled to the first sampling port and the common terminal,
the n number of second press-button sub-circuits includes a number of three second press-button sub-circuits, coupled to the second sampling port and the common terminal, and the i number of third press-button sub-circuits includes one third press-button sub-circuit, coupled to the first node and the common terminal.

7. The press-button circuit according to claim 1, further comprising:
a third sampling port,
a third control device,
a fourth control device,
a second node, coupled to the third sampling port via the third control device, and coupled to at least the first sampling port via the fourth control device, wherein the second node is further coupled to the second sampling port via the first and second control devices, and
at least one fourth press-button sub-circuit, coupled to the second node and the common terminal,
wherein:
the third control device is configured to control a connection between the second node and the third sampling port, and
the fourth control device is configured to control a connection between the second node and, the first and second sampling ports.

8. The press-button circuit according to claim 1, wherein:
each of the m number of first press-button sub-circuits, the n number of second press-button sub-circuits, and the i numbers of third press-button sub-circuits includes a key configured in series with a fixed-value resistor.

9. The press-button circuit according to claim 1, wherein: each of the first and second control devices includes one of a variable resistor, a switch, a transistor, and a potentiometer.

10. The press-button circuit according to claim 1, wherein the common terminal is connected to a ground.

11. A display device, comprising: a keypad, comprising the press-button circuit according to claim 1.

12. The display device according to claim 11, wherein the keypad includes:
a motherboard controller, including:
a first general purpose input output (GPIO) port, coupled to the first sampling port, and
a second general purpose input output (GPIO) port, coupled to the second sampling port,
wherein:
the motherboard controller is configured to provide a voltage to the common terminal.

13. A method for driving a press-button circuit, comprising:
providing the press-button circuit, including: a node, coupled to a first sampling port via a first control device, and coupled to a second sampling port via a second control device; m number of first press-button sub-circuits, coupled to the first sampling port and a common terminal; n number of second press-button sub-circuits, coupled to the second sampling port and the common terminal; and i number of third press-button sub-circuits, coupled to the node and the common terminal, wherein m, n, and i are integers of 1 or greater;

controlling the first and second control devices, such that the m number of first press-button sub-circuits, the n number of second press-button sub-circuits, and the i number of third press-button sub-circuits form a sampling port through a first circuit arrangement including the m number of first press-button sub-circuits, the n number of second press-button sub-circuits, and the i number of third press-button sub-circuits;

controlling the first and second control devices, such that the first sampling port uses a second circuit arrangement including the m number of first press-button sub-circuits and the n number of second press-button sub-circuits, and the second sampling port uses a third circuit arrangement including the i number of third press-button sub-circuits; and controlling the first and second control devices, such that the first sampling port uses a fourth circuit arrangement including the m number of first press-button sub-circuits, and the second sampling port uses a fifth circuit arrangement including the n number of second press-button sub-circuits and the i number of third press-button sub-circuits.

14. The method according to claim 13, wherein:
each of the m number of first press-button sub-circuits, the n number of second press-button sub-circuits, and the i number of third press-button sub-circuits includes a voltage divider.

15. The method according to claim 13, wherein:
each of the first and second control devices is one of a variable resistor, a switch, a transistor, and a potentiometer.

16. The method according to claim 13, wherein the controlling the first and second control devices includes:
switching on the first and second control devices to provide the first circuit arrangement,
switching on the first control device and switching off the second control device to provide the second circuit arrangement for the first sampling port and to provide the third circuit arrangement, and switching off the first control device and switching on the second control device to provide the fourth circuit arrangement and to provide the fifth circuit arrangement.

17. The method according to claim 13, wherein:
each of voltage dividers of any two of all of the m number of first press-button sub-circuits and the i number of third press-button sub-circuits includes a fixed-value resistor having a different resistance.

18. The method according to claim 13, wherein:
each of voltage dividers of any two of all of the n number of second press-button sub-circuits and the i number of third press-button sub circuits includes a fixed-value resistor having a different resistance.

19. The method according to claim 13, wherein the common terminal is connected to a ground.

* * * * *